US005926489A

United States Patent [19]
Luthi et al.

[11] Patent Number: 5,926,489
[45] Date of Patent: Jul. 20, 1999

[54] NON-EQUALIZED DIGITAL RECEIVER USING BLOCK DECODING WITH ERASURE AND ERROR CORRECTION

[75] Inventors: Daniel A. Luthi, San Jose; Ravi Bhaskaran, Santa Clara; Dojun Rhee, San Jose; Advait M. Mogre, Fremont, all of Calif.

[73] Assignee: LSI Logic Corporation, Milpitas, Calif.

[21] Appl. No.: 08/754,875

[22] Filed: Nov. 22, 1996

[51] Int. Cl.⁶ .............................. H04L 1/20; H03M 13/22
[52] U.S. Cl. ...................... 371/37.06; 371/39.1; 375/346
[58] Field of Search .............................. 371/37.02, 37.11, 371/39.1, 37.06; 375/346, 285, 324, 328, 340

[56] References Cited

U.S. PATENT DOCUMENTS

| | | | |
|---|---|---|---|
| 4,829,525 | 5/1989 | Sugiyama et al. | 371/38 |
| 4,845,713 | 7/1989 | Zook | 371/37 |
| 4,928,288 | 5/1990 | D'Aria et al. | 375/17 |
| 5,023,889 | 6/1991 | Divsalar et al. | 375/27 |
| 5,088,113 | 2/1992 | Wei | 375/53 |
| 5,113,400 | 5/1992 | Gould et al. | 371/43 |
| 5,351,274 | 9/1994 | Chennakeshu et al. | 375/100 |
| 5,430,743 | 7/1995 | Marturano et al. | 371/43 |
| 5,708,665 | 1/1998 | Luthi et al. | 371/5.1 |

OTHER PUBLICATIONS

Sundberg et al., "A Class of Soft Decision Error Detectors for the Gaussian Channel", IEEE Transactions on Communications, Jan. 1976, pp. 106–112.

Hagenauer, "Forward Error Correction Coding for Fading Compensation in Mobile Satellite Channels", IEEE Journal on Selected Areas in Communications, vol. SAC–5, No. 2, Feb. 1987, pp. 215–225.

Sargrad et al., "Errors–and–Erasures Coding to Combat Impulse Noise on Digital Subscriber Loops", IEEE Transactions on Communications, vol. 38, No. 8, Aug. 1990, pp. 1145–1155.

Frank et al., "Tradeoffs in Concatenated Coding for Frequency–Hop Packet Radio with Partial–Band Interference", MILCOM '92, pp. 0125–0129, Dec. 1992.

Ryan et al., "A Method of Analysis for Interleaved Reed–Solomon Coding with Erasure Decoding on Burst Error Channels", IEEE Transactions on Communications, vol. 41, No. 3, Mar. 1993, pp. 430–434.

Kwon et al., "Error–and–Erasure Decoding of Convolutional Coded DS/SSMA Communications in AWGN and Rayleigh Fading Channels", 1995 International Symposium on Information Theory, p. 27, Dec. 1995.

*Primary Examiner*—Stephen M. Baker

[57] ABSTRACT

A communications receiver system is presented for detecting burst errors and providing erasure information to a block decoder, thereby effectively doubling the conventional correction capability of the block decoder with only a minimal increase in complexity. In one embodiment, the receiver includes a demodulator which includes circuitry to detect error bursts in the received symbol sequence. Once detected, the locations of symbols in error are marked in the form of erasure flags. An error correction decoder is then able to correct up to twice as many errors with the additional information provided by the erasure flags.

17 Claims, 4 Drawing Sheets

NON-EQUALIZED DIGITAL RECEIVER USING BLOCK DECODING WITH ERASURE AND ERROR CORRECTION

BACKGROUND OF THE INVENTION

1. Field of the Invention

This invention relates to the field of digital communication systems such as those that might be used for satellite transmission channels and cable channels, and in particular to methods of improved decoding of error correction coded signals in systems without digital equalization.

2. Description of the Relevant Art

The history of error correction coding begins with a discovery that any communications channel has a calculable capacity such that information transmission at a rate which does not exceed the capacity can be achieved with as small an error rate as desired. This information transmission is accomplished via the use of error correction coding. The discovery was based on ensemble averages, and consequently did not provide a useful code construction technique. An extensive amount of effort was expended in developing explicit code constructions which would provide asymptotically vanishing error rates, without success. The class of Hamming codes was then introduced, but these codes were only capable of correcting single errors. Other block codes were later developed, but they were accompanied by no general construction theory. In the late 1950's, a probabilistic approach to the decoding problem led to the development of tree codes, which have been primarily represented by convolutional codes. Then around 1960, Reed-Solomon codes and the more general Bose-Chadhuri-Hocquenghem codes provided a large class of multiple error correcting codes, which comprise one of the most important classes of block codes today. However, the performance of these codes suffers when extended to large block lengths. In the late 1960's and early 1970's the Viterbi decoder was introduced as a replacement for the sequential decoding of tree codes, thereby strengthening the feasibility of convolutional coding. Finally, in the 1970's the Justesen and Goppa code families were introduced which provided good codes with long block lengths, albeit with significantly more complex decoding algorithms.

Figure 1:
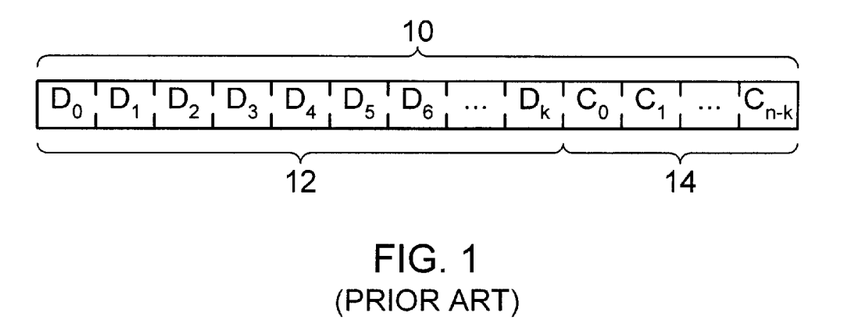
FIG. 1 is a code word comprising a structured sequence of data symbols and check symbols encoded according to a block and/or convolutional encoder.
Figure 2:
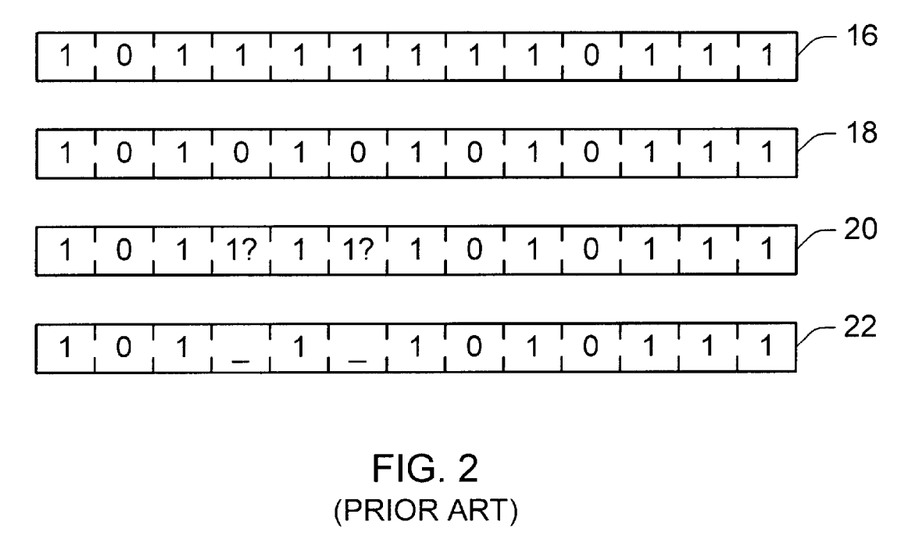
FIG. 2 is set of code words exemplifying a correct code word, an incorrect yet valid code word, a corrupted version of the correct code word with errors, and a corrupted version of the correct code word with erasures.

Error control codes function by accepting input data symbols and processing them in such a way as to add some redundancy to the symbol sequence. All error control codes can be formulated so that this coding process takes the form of adding check symbols to the data symbol sequence. With this formulation, the encoder accepts an input word of k data symbols at each time step and produces a code word with n symbols, k of which are the input data symbols, and n-k of which are the check symbols. An example of such a code word 10 having k data symbols 12 and n-k check symbols 14 is shown in FIG. 1. The redundancy added by the check symbols serves to increase the distance between valid code symbol sequences. A common measure of the distance between two code words is the number of symbols in which they differ, defined herein as the Hamming distance. Shown in FIG. 2 are two code words 16 and 18 which are selected from the set of valid code words that make up an example block code. A comparison of two code words 16 and 18, shown in FIG. 2 reveals three symbol positions which differ: $D_3$, $D_5$, and $D_7$. Thus the Hamming distance between code words 16 and 18 is three. The minimum Hamming distance between any two sequences of code words is called the minimum Hamming distance of the code, and is often denoted $d^H_{min}$. For a block code, each code word is unrelated to other code words, so this distance corresponds to the minimum Hamming distance between any two code words. In FIG. 2, the code words 16 and 18 are the nearest valid code words, so for this code $d^H_{min}=3$.

When code words are transmitted across a noisy channel, they are often subject to corruption. This corruption typically takes the form of symbol errors in the code word. Usually the locations of these errors are unknown prior to decoding, but in some cases it is possible to determine the locations of these errors prior to decoding. When this occurs, it is advantageous to mark their locations in some manner so that these symbols are disregarded in the decoding process. When this is done, these errors which are characterized by an unknown error value but a known error location can be referred to as erasures. The circumstances under which the code word will be correctly decoded are provided by the following equation:

$$n_E + 2n_e \leq d^H_{min} - 1$$

where $n_E$ is the number of erasures and $n_e$ is the number of errors.

To illustrate the above equation, assume that code word 18 is transmitted and received as a corrupted code word 20 with two symbol errors. Consider the well known decoding algorithm wherein the received code word is compared to all valid code words, and the valid code word that is most like the received code word is chosen as the correct code word. Decoding is then accomplished by simply removing the check symbols from the chosen code word. In FIG. 2 code word 20 represents a received code word that contains two symbol errors. According to the equation, code word 20 may be incorrectly decoded, and indeed it differs by only one symbol from code word 16. According to the stated decoding algorithm, incorrect code word 16 is chosen, resulting in a decoding error. However, when the knowledge of the error locations is applied as shown by code word 22, then these symbols are ignored in the comparison process and code word 22 matches the correct code word 18. Consequently code word 22 with erasures is correctly decoded. In general, the number of erasures that a code can tolerate without making decision errors is twice the number of unerased errors that it can tolerate. Further details on the design and function of error correction codes may be found in Bernard Sklar, Digital Communications: Fundamentals and Applications, Prentice Hall, Englewood Cliffs N.J., pp. 263–365, 1988, incorporated herein by reference.

While this relation between error and erasure tolerance is well known, a practical mechanism for detecting error locations before decoding is not. The above equation shows that erasures and errors both impair the ability to decode correctly, and the advantage gained by using erasures is the provision of additional side information to the decoder. when erasures are misapplied, that is, when the location of errors is misidentified, then decoding performance worsens.

The art of code design revolves around optimizing the tradeoff between rate reduction and Hamming distance gain for a given code complexity. Reed-Solomon codes are extremely popular because this family of codes is based on a construction that allows for custom tailoring of the information rate and Hamming distance properties of the code. Furthermore, efficient decoders are easy to design for these codes. However at large block lengths, the performance of Reed-Solomon codes suffers a loss of efficiency. A technique for extending the effective block length of these codes is to follow the Reed-Solomon encoder with an interleaver which acts to intersperse the symbols from one code word with the symbols from other code words. One way to do this is by writing the code words into a memory matrix column-wise and reading the completed matrix row-wise. The interleaver can then be followed by a convolutional encoder which further adds redundancy to the symbol sequence. At the receiving end the process is reversed, first applying a convolutional decoder to the received sequence, next applying a de-interleaver, and finally performing the Reed-Solomon block decode. Each of the additional steps adds only a moderate amount of complexity to the system while significantly boosting its performance.

This arrangement is typically used in environments where code symbol errors caused by the channel tend to occur randomly or in bursts. Burst errors are not random isolated errors, but rather burst errors are defined as errors which occur in localized groups. For example, in the case of the satellite receiver system, the nature of the errors on the channel is typically random, although when a concatenated decoder is used, errors in convolutional decoding tend to be burst errors. A method for detecting burst errors of the convolutional decoder would prove advantageous in assisting the following block decoder. Apart from the random noise, other effects may corrupt the transmitted signal. These effects are more bursty in nature (examples: microwave radiation close to the receiving antenna, lightning, home appliance electrical noise, etc.). The de-interleaver acts to distribute errors within a group so that they are isolated and fewer occur within a given code word. This in turn enhances the probability that the number of errors will not exceed the correction capability of the Reed-Solomon code. Nevertheless, it is still necessary to use Reed-Solomon codes of moderate length and complexity to keep the error correction capability high enough to preserve their resistance to burst errors.

Since error correction coding necessitates the transmission of check symbols in addition to the data symbols, the bandwidth available to the data symbols can be decreased to make room for the check symbols, or additional bandwidth can be allocated for the check symbols. The first option results in a reduction of the rate at which data can be transmitted, and the second option results in an increase in overall channel bandwidth. Typically one of these options is required, but the tradeoff is increased manufacturing tolerances, increased margin for equipment degradation, a reduction of the required signal-to-noise ratio, and an overall reduced probability of error.

SUMMARY OF THE INVENTION

The problems outlined above are in large part solved by receiver with a mechanism for detecting burst errors and providing erasure information to the block decoder, thereby increasing the conventional correction capability of the block decoder with only a small increase in complexity. In one embodiment, the receiver includes a demodulator modified to detect error bursts in the received symbol sequence. Once detected, the locations of symbols in error are marked in the form of erasure flags. An error correction decoder is then able to correct up to twice as many errors with the additional information provided by the erasure flags.

Broadly speaking, the present invention contemplates a receiver for detecting and correcting errors within a received signal. The receiver comprises a demodulator coupled to a block decoder. The demodulator includes a matched filter coupled to receive a modulated signal from an analog channel. The output of the matched filter is operatively coupled to an analog-to-digital converter. The combination of these elements provides a demodulated signal comprising a sequence of noise-corrupted symbols. The demodulator further includes a circuit for determining the energy of the noise which corrupts each symbol. The noise energy is passed through a filter which functions to determine an average noise energy. A threshold detector is then used to determine if the average noise energy exceeds a given threshold and, once the threshold has been exceeded, the detector asserts erasure flags. The erasure flags are aligned with the symbols having error signal values which exceed the noise threshold (after averaging). The erasure flags thereby serve to identify the locations of symbol errors in the demodulated signal. The erasure flags are passed to the block decoder in conjunction with the demodulated signal. The block decoder then detects and corrects errors in the demodulated signal and provides a decoded symbol sequence.

The present invention also contemplates a communications system comprising an encoder, a modulator, an analog channel and a receiver which are all serially coupled in the order listed. The encoder accepts a digital signal and converts it to an encoded signal. The encoded signal is modulated by the modulator and transmitted via the analog channel to the receiver. The receiver has a noise threshold detector which provides erasure flags aligned with burst error locations in a codeword. The erasure flagged codewords are then decoded though use of a block decoder. The receiver thereby receives the transmitted signal and converts the transmitted signal to substantially the original digital signal.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
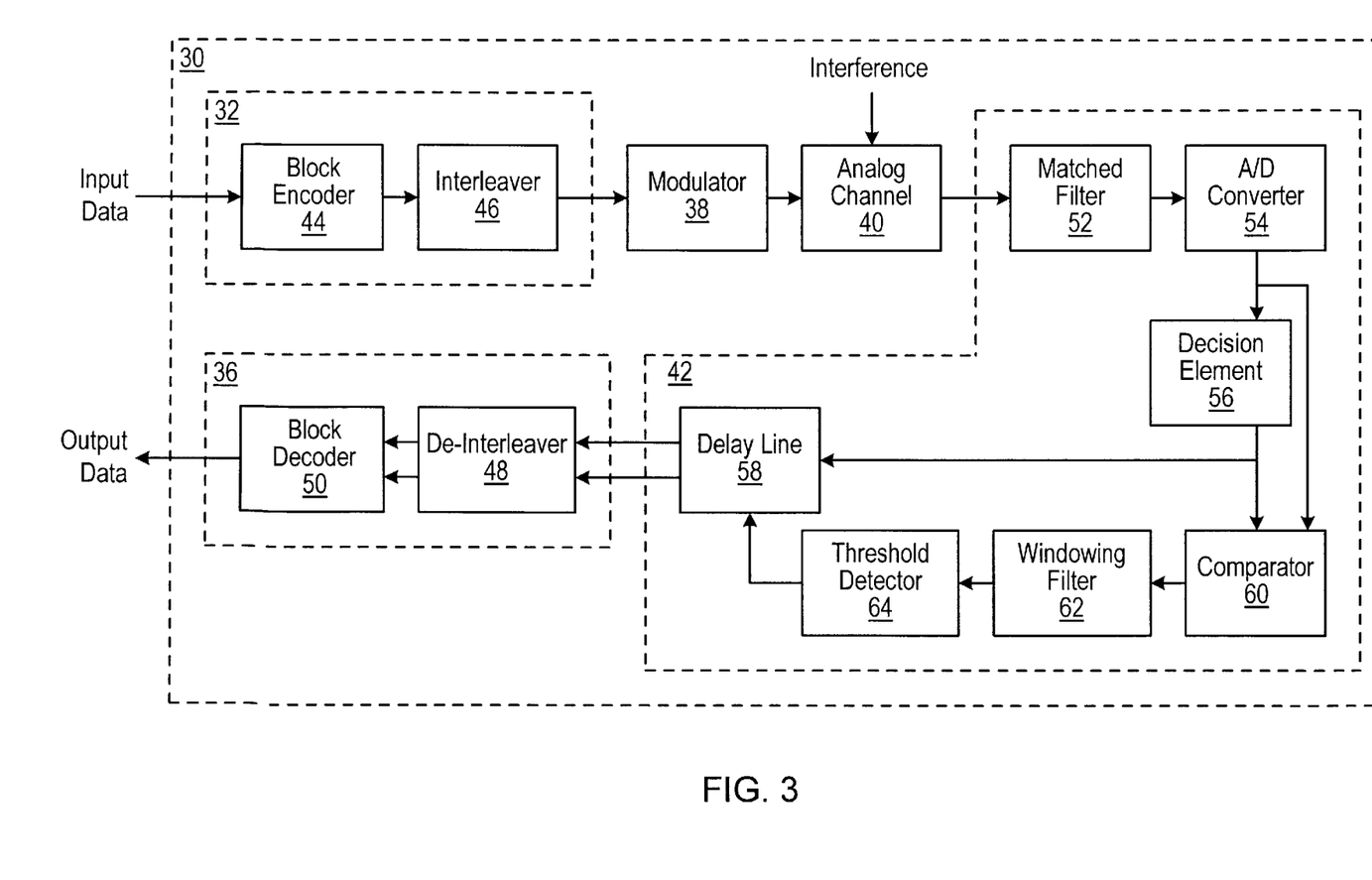
FIG. 3 is a block diagram of a first embodiment of a digital communications system having an improved demodulator capable of providing symbol erasure information to a error correction decoder.

Turning now to the drawings, FIG. 3 represents first embodiment of a digital communications system 30 which employs an improved demodulator. Digital communications system 30 comprises an encoder 32, a modulator 38, an analog channel 40, a demodulator 42, and a decoder 36, all of which are coupled serially in the order listed.

Digital communications system 30 serves to accept, transport and reliably reconstruct input data. Digital communications system 30 uses an encoder-decoder pair to implement an error correction code such as a Reed-Solomon block code. Usage of error correction coding decreases the probability of a symbol error and thereby increases the reliability of the system. Encoder 32 encodes the input data stream. Modulator 38 converts the encoded data stream into a modulated signal which can be transported via analog channel 30. Analog channel 40 is subject to interference which corrupts the modulated signal. The interference typically appears as an additive noise signal. The signal received at the output of analog channel 40 is the sum of the noise signal and the modulated signal. Demodulator 42 accepts the noise-corrupted receive signal and converts it to a detected data stream. The detected data stream is ideally the same as the encoded data stream, but due to the noise corruption, may contain symbol errors. In many channel environments, the interference is subject to "bursty" behavior, i.e. short, intense increases in the level of interference. This behavior results in groups of symbol errors in the detected data stream. Demodulator 42 detects the increases in interference level and provides a sequence of erasure flags to identify the groups of errors in the detected data stream. Decoder 36 converts the detected data stream into an output data stream, using the sequence of erasure flags to increase the number of symbol errors which may be corrected.

Encoder 32 performs two functions: error correction encoding and interleaving. To achieve this, a preferred encoder hereof comprises a block encoder 44 and an interleaver 46. Block encoder 44 encodes the input data preferably using a Reed-Solomon encoding scheme. Interleaver 46 acts to take adjacent code symbols and disperse them in the encoded data stream. A de-interleaving operation is performed after transmission, with the result that the dispersed symbols will be recollected to their initial positions (prior to interleaving) before entering the decoder. This prevents a typical noise burst from causing enough symbol errors in one code word to exceed the correction limit of the code being used.

Modulator 38 converts the encoded data stream into a modulated signal which analog channel 40 can transport. Any known digital modulation technique may be used, including antipodal signaling, orthogonal signaling, multi-amplitude signaling, multi-phase signaling, and quadrature signaling. The modulation method is chosen as one which has less susceptibility to interference on analog channel 40.

Analog channel 40 may comprise either a transmission or storage medium by which the modulated signal can be transported across space and/or time. Transmission media which accomplish the former include microwave links, wave guides, transmission lines, telephone lines and optic fibers. Storage media which accomplish the latter include magnetic media, compact disks, and random-access memory. Regardless of the channel function, the modulated signal experiences some interference in the form of an additive noise signal. The interference may cause symbol errors at certain symbol locations present at the output of demodulator 42. This is the motivation for using error correction coding hereof.

Demodulator 42 recovers a noise-corrupted version of the modulated signal and converts it to a detected data stream with associated erasure flags. The detected data stream is ideally equal to the encoded data stream, but due to the noise corruption, symbol errors may exist. Demodulator 42 will identify symbol errors by asserting an erasure flag for locations in which symbol errors are present. Demodulator 42 comprises a matched filter 52, an analog-to-digital (A/D) converter 54, a decision element 56, and a delay line 58, which are all coupled serially within a communication path in the order listed. Demodulator 42 further comprises a comparator 60, a windowing filter 62, and a threshold detector 64 coupled outside the communication path.

Matched filter 52 filters the noise-corrupted modulated signal in preparation for A/D conversion. The purpose of a matched filter is to maximize the signal-to-noise ratio of an information-carrying signal. As explained in many standard texts (e.g.—see Simon Haykin, "Communication Systems, 2ed", © 1983 John Wiley & Sons, New York, pp. 530–540, incorporated herein by reference) this is accomplished by designing the filter response to be a time-reversed replica of the un-modulated signal. The output signal of matched filter 52 is sampled by A/D converter 54, which then provides a digital filtered signal. Alternate methods for producing the digital filtered signal from the noise-corrupted modulation signal are discussed later, and it is intended that these methods be included in the scope of the present invention.

Thus demodulator 42 contains matched filter 52 and A/D converter 54 in the communication path. Two additional elements are placed in the communication path: decision element 56 and delay line 58. Decision element 56 accepts a sequence of digital filtered signal samples and operates on each of them to determine the closest code symbol. The sequence of code symbols provided by decision element 56 forms a detected symbol stream which passes through delay line 58. Delay line 58 acts to buffer the code symbols until an erasure flag for each code symbol is determined. Once each symbol obtains an associated erasure flag, the symbol is passed with its erasure flag to decoder 36.

The erasure flags are generated outside the communication path in the following manner. Comparator 60 is coupled to compare the input and output of decision element 56. Comparator 60 compares the detected symbols at the output of decision element 56 to the digital filtered signal samples at the input of decision element 56. Assuming that the detected symbols are correct, the difference between the input and output of decision element 56 is a sequence of error values due to interference on analog channel 40. The sequence of error values is hereby defined to be an error signal. Comparator 60 squares the error signal to provide an error energy signal. Alternatively, the error energy signal may be formed by taking the absolute value of the error signal.

The output line from comparator 60 couples the error energy signal to windowing filter 62, which in turn is coupled to threshold detector 64. An average error energy signal is then formed by averaging the portion of the error energy signal contained in a time interval. One method for accomplishing this is by passing the error energy signal through windowing filter 62. One implementation for windowing filter 62 is a shift register of a specified length that stores the past samples of the error energy signal, and a summer that sums the contents of the shift register. The average error energy signal is compared against a threshold parameter by threshold detector 64. The threshold parameter is chosen so that when the average error energy signal exceeds the parameter value, this indicates the presence of an error burst (i.e. a group of symbol errors) in delay line 58.

Threshold detector 64 is coupled to conditionally set erasure flags of symbols contained by delay line 58. Threshold detector 64 asserts the erasure flags associated with error symbols as indicated by the above-threshold average error energy signal. The detected symbol sequence with associated erasure flags is then forwarded to decoder 36. The erasure flags are then attributed in proper time sequence to the symbols within the code word via delay line 58. Delay line 58 essentially operates as a buffer for storing code words as they arrive across the communication channel. The amount of delay within the buffer is adjusted so that each symbol of a code word is delayed sufficiently to allow a flag associated with that symbol to be placed with its corresponding symbol. Since comparing, windowing, and thresholding functions require a defined amount of time, the delay amount of delay line 58 equal the throughput delay associated with those elements.

Decoder 36 has two functions: de-interleaving and decoding. Decoder 36 is comprised of de-interleaver 48 and block decoder 50. De-interleaver 48 is coupled to receive the detected symbol sequence with associated erasure flags and produce a de-interleaved symbol sequence with associated erasure flags by reversing the actions of interleaver 46. The de-interleaved symbol sequence is ideally equal to the encoded data stream, but the interference on analog channel may result in the presence of errors in the de-interleaved symbol sequence. If a burst error is present in the detected symbol sequence, the effect of the de-interleaving will be to disperse the symbol errors in the de-interleaved symbol sequence so that the symbol errors are no longer adjacent each other. This dispersion aspect provides improved block decoder performance since each code word is made to contain fewer symbol errors.

Block decoder 50 serves to convert the de-interleaved symbol sequence with associated erasure flags to an output data stream which is ideally equal to the input data stream. Block decoder 50 is preferentially a Reed-Solomon decoder chosen to invert the operation of block encoder 44. Block decoder 50 is designed to correct symbol errors using the additional information provided by the erasure flags to double the maximum number of errors which can be corrected in a code word. Recall from the background discussion that if all the symbol error locations are known, twice as many errors can be corrected than if none of the symbol error locations are known. Since the erasure flags serve to indicate the location of symbol errors, block decoder 50 is designed to make use of this information, and thereby attain the increased error correcting capability. Digital communications system 30 consequently attains a substantially increased reliability with only a small increase in complexity.

A correspondence in reliability and complexity exists. The correspondence may be manipulated in the following manner. If the improved reliability is much greater than what is required, simpler block encoder-decoder pair with reduced error correction capability may be used. This effectively reduces the overall system complexity while maintaining or slightly improving the overall system reliability through use of the improved demodulator.

Decision element 56 may take the form of one or more comparators, each of which simply determines whether a digital filtered signal sample is greater than or less than a given value. The given values are chosen to be the midpoints between valid symbol values. In this manner, the decision element is able to find the valid symbol value closest to the digital filtered signal sample, in effect rounding or truncating the signal sample. The closest valid symbol value is chosen as the correct symbol. This is often referred to as making a hard decision. One example of the function of the decision element follows: Let valid symbol values be 0,1,2, and 3. Assume the received digital filtered signal samples are 1.1, 5.7, and 1.6. The decisions rendered by the decision element are 1, 3, and 2, respectively.

The distance between the digital filtered signal sample and the valid symbol value is determined by the interference on analog channel 40. If analog channel 40 were perfect, the digital filtered signal would be equal to the encoded data stream. By taking the absolute value or square of the distance, an error energy signal representing the level of the interference on the channel is generated. This error energy signal can then be processed in one of several manners. An estimated error power can be generated by averaging a fixed number of past noise signals. This is the approach provided by the windowing filter. Recall that the windowing filter consists of a shift register and a summer which sums the contents of the shift register. It is expected that an error burst will be characterized by a sudden jump in the difference between the current and previously estimated error power. When threshold detector 64 detects this sudden jump, the corresponding symbol locations in the detected symbol stream have an erasure flag set. Once the estimated error power returns below the threshold for subsequent symbol locations, the erasure flags are reset for the subsequent symbol locations.

Figure 4:
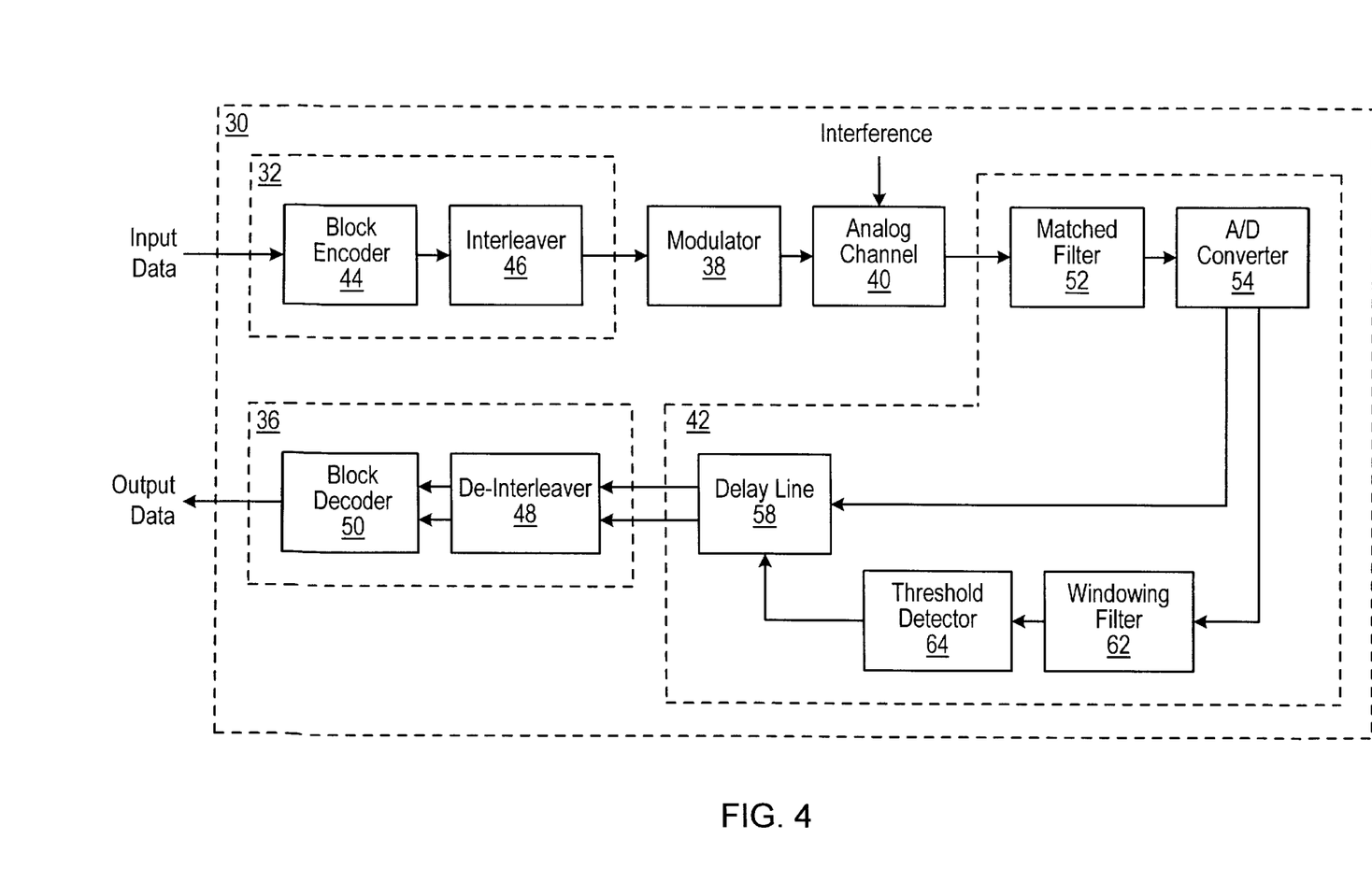
FIG. 4 is a block diagram of a second embodiment of a digital communications system having an improved demodulator capable of providing symbol erasure information to an error correction decoder.

Turning now to FIG. 4, a digital communications system 30 is shown with an alternate embodiment of demodulator 42. In this alternate embodiment, demodulator 42 performs the same function as before without use of a decision element or a comparator. Elimination of the decision element and comparator is accomplished by manipulating the bits within the digital filtered signal provided by A/D converter 54.

Figure 5:
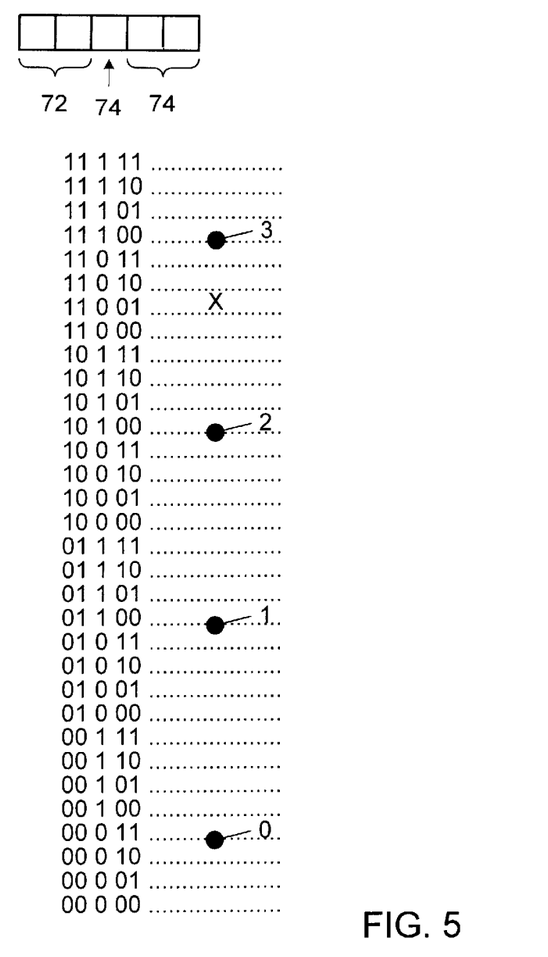
FIG. 5 is an example of a binary number splitting scheme by which use of a decision element and comparator may be avoided.

Referring to FIG. 5, exemplary bits within a digital filtered signal are shown. A set of most significant bits 72 will represent the detected symbol value. A next most significant bit 74 will be an inversion bit. A set of remaining bits 76 will be the error value. The bits are partitioned, each partition being separately routed. Referring to FIGS. 4 and 5 in combination, the most significant bits 72 are routed to delay line 58. The inversion bit 74 and the remaining bits 76 are routed to the windowing filter 62 which is augmented with a logic gate that forms the error energy signal by inverting the remaining bits 76 if and only if the inversion bit 74 is false. This forms an approximate absolute value of the error signal.

FIG. 5 provides an example of this bit manipulation technique. In this example, the A/D converter output consists of five bits, and there are four valid symbol values 0,1,2, and 3 as indicated by the dots. The two most significant bits form a bit pair 72 which represents the symbol value. The next most significant bit is an inversion bit 74. The two least significant bits form an error signal value 76. To find an absolute value of the error signal value, the bits forming error signal value 76 are inverted if and only if inversion bit 74 is zero. For example, assume that the digital filtered signal sample provided by the A/D converter is 10001, as indicated by the x in FIG. 5. The most significant bits 72 (10) represent the symbol value 2. The most significant bits are routed to delay line 58. The inversion bit 74 (0) is false, indicating that the remaining bits 76 (01) must be inverted to determine the absolute value of the error signal. Thus the absolute value of the error signal is 2, or 10 in binary. The inversion is performed by windowing filter 32 prior to storage of the value in the shift register.

Figure 6A:
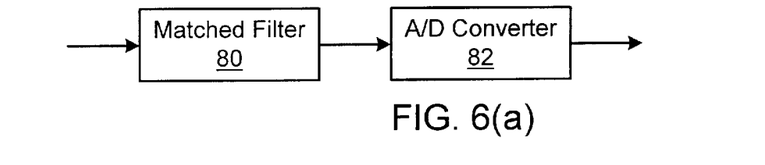
FIG. 6 is a block diagram showing two equivalent methods by which demodulation may be achieved.
Figure 6B:
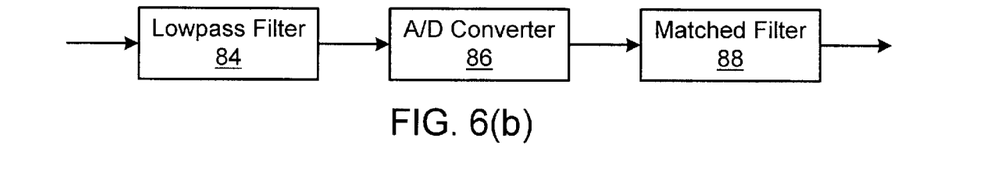

FIG. 6 is used to illustrate the fact that the digital filtered signal may be generated by alternate means without adversely affecting the performance of demodulator 42. It should be recognized that filtering which is performed in the continuous time domain can also be performed in the digital domain when certain criteria are met. FIG. 6a shows a matched filter 80 followed by A/D converter 82. This is the above disclosed method for generating the digital filtered signal from the noise-corrupted modulated signal. In some applications where the sampling frequency of the A/D converter is more than twice the highest frequency component of the modulated signal, the matched filter may be replaced by a low-pass filter, and the matched filtering operation performed digitally after the noise-corrupted modulated signal has been converted to a digital signal. This observation follows from a well-known theorem that no information is lost in the conversion from the continuous-time domain to the digital domain if the sampling frequency exceeds twice the highest frequency component of the continuous-time signal. If proper sampling occurs, moving the matched filtering operation to the digital domain operates the same as if matched filtering occurs prior to A/D conversion. FIG. 6b shows a configuration which accomplishes this, and which may be regarded as equivalent to FIG. 6a. In FIG. 6b, a low-pass filter 84 is followed by an A/D converter 86, which is then followed by a digital matched filter 88. In some applications the desired sampling frequency is not twice the highest frequency component of the continuous time signal. In these applications the configuration of FIG. 6b may still be used if the sampling frequency of the A/D converter is first increased as required. Then, after the matched filter, a decimation operation is performed to reduce the sampling frequency back to the desired level.

Numerous variations and modifications will become apparent to those skilled in the art once the above disclosure is fully appreciated. It is intended that the following claims be interpreted to embrace all such variations and modifications.

What is claimed is:

1. A communications system comprising:
    an encoder configured to receive a digital signal and thereafter convert said digital signal to a coded digital signal;
    a modulator coupled to receive said coded digital signal and thereafter convert said coded digital signal to a modulated signal;
    an analog channel adapted to receive said modulated signal and subject to interference imputed thereon; and
    a demodulator configured to provide a sequence of demodulated code symbols and erasure flags associated with said sequence of demodulated code symbols at a time period in which an average level of said interference exceeds a threshold amount.

2. The communication system as recited in claim 1, wherein said demodulator comprises:
    an analog-to-digital converter operably coupled to convert said modulated signal after filtering to a sequence of samples; and
    a delay line for storing said sequence of demodulated code symbols and attributing an erasure flag to one of said symbols for which the interference associated therewith exceeds said threshold amount.

3. The communication system as recited in claim 2, wherein said erasure flag is set during said time period in which said interference exceeds a threshold amount.

4. The communication system as recited in claim 2, wherein said demodulator further comprises:
    a digital filter coupled to an output of said analog-to-digital converter for determining an average error value from a set of said sequence of samples; and
    a threshold detector coupled to receive said average error value and assert said erasure flag whenever said average error value exceeds said threshold value.

5. The communications system as recited in claim 2, wherein a binary representation of said sequence of samples is split into an integer component and a fractional component, wherein said sequence of demodulated code symbols is said integer component, and wherein an error energy signal is a function of said fractional component.

6. The communications system as recited in claim 2, wherein said sequence of demodulated code symbols is output by a decision element coupled to receive said sequence of samples and provide a nearest symbol value, and wherein a comparator provides an error energy signal by taking the absolute value of the difference of said sequence of samples and said sequence of demodulated code symbols.

7. The communication system as recited in claim 1, further comprising a decoder coupled to receive said sequence of demodulated code symbols and said erasure flags, configured to correct erasures and errors in said sequence of demodulated code symbols with said erasure flags, and configured to convert said sequence of demodulated code symbols to substantially said digital signal.

8. The communications system as recited in claim 1, wherein said analog channel comprises a telephone line.

9. The communications system as recited in claim 1, wherein said encoder comprises:
    a Reed-Solomon encoder configured to convert said digital signal to a non-interleaved coded digital signal; and
    an interleaver coupled to receive said non-interleaved coded digital signal and thereafter provide said coded digital signal by re-ordering symbols in said non-interleaved coded digital signal in accordance with a standard block interleaver scheme.

10. A receiver apparatus for detecting and correcting errors within a received signal, comprising:
    a demodulator configured to provide a demodulated coded digital signal with associated erasure flags indicative of regions with excessive values of an interference signal, said demodulator comprising:
        a matched filter coupled to receive a modulated signal and thereafter convert said modulated signal to a filtered signal;
        an analog-to-digital converter coupled to receive said filtered signal and thereafter convert said filtered signal to a digital filtered signal from which said demodulated coded digital signal is determined;
        a windowing filter coupled to receive an error energy signal and thereafter provide an average error energy signal; and
        a threshold detector coupled to receive said average error energy signal and assert an erasure flag whenever said average error energy signal exceeds a threshold value; and
    a decoder coupled to receive said demodulated coded digital signal with associated erasure flags, configured to correct erasures and errors in said demodulated coded digital signal with associated erasure flags, and configured to convert said demodulated coded digital signal to an original digital signal.

11. The receiver apparatus as recited in claim 10, wherein a binary representation of said digital filtered signal is split into an integer component and a fractional component, wherein said demodulated coded digital signal is said integer component, and wherein said error energy signal is a function of said fractional component.

12. The receiver apparatus as recited in claim 10, wherein said demodulated coded digital signal is output by a decision element coupled to receive said digital filtered signal and provide a nearest symbol value, and wherein a comparator provides said error energy signal by taking the difference of said digital filtered signal and said demodulated coded digital signal.

13. The receiver apparatus as recited in claim 10, wherein said decoder comprises:

a de-interleaver coupled to receive said demodulated coded digital signal with associated erasure flags and thereafter reorder symbols and associated erasure flags therein in accordance with a standard block de-interleaver scheme to produce a de-interleaved signal with associated erasure flags; and a block decoder coupled to receive said de-interleaved signal with associated erasure flags, configured to correct erasures and errors in said de-interleaved signal with associated erasure flags, and configured to thereafter convert said de-interleaved signal to substantially said digital signal.

14. The apparatus as recited in claim 13, wherein said erasure flag is set in each of multiple locations within a region of said demodulated coded digital signal corresponding to intervals in which values of said average error energy signal exceed said threshold value.

15. The apparatus as recited in claim 14, wherein said multiple locations are adjacent within said demodulated coded digital signal prior to entry into said de-interleaver and are separated within said coded digital signal after exit from said de-interleaver.

16. The apparatus as recited in claim 15, wherein said erasure flag may be set in multiple locations of a code word at approximately twice the quantity of erroneous symbols correctable by an apparatus absent said erasure flag.

17. A method for locating erroneous symbols within a demodulated coded digital signal, comprising:

performing analog-to-digital conversion of an analog filtered signal to a digital filtered signal represented by a sequence of binary values;

splitting each binary value in said sequence into an integer component and a fractional component;

providing said integer components as said demodulated coded digital signal;

forming an error energy signal from said fractional components;

passing said error energy signal through a windowing filter to generate an average error energy signal;

comparing said average error energy signal to a threshold value and asserting an erasure flag for regions of said demodulated coded digital signal in which said average error energy signal exceeds said threshold value.

* * * * *